United States Patent
Lin

(10) Patent No.: US 8,934,236 B2
(45) Date of Patent: Jan. 13, 2015

(54) SERVER CABINET

(75) Inventor: Chih-Hao Lin, New Taipei (TW)

(73) Assignee: ScienBiziP Consulting(Shenzhen)Co., Ltd., Guangdong (CN)

( * ) Notice: Subject to any disclaimer, the term of this patent is extended or adjusted under 35 U.S.C. 154(b) by 164 days.

(21) Appl. No.: 13/551,629

(22) Filed: Jul. 18, 2012

(65) Prior Publication Data
US 2014/0009892 A1 Jan. 9, 2014

(30) Foreign Application Priority Data
Jul. 4, 2012 (TW) ................................ 101123960

(51) Int. Cl.
*H05K 7/14* (2006.01)

(52) U.S. Cl.
USPC ....... 361/679.49; 361/694; 361/695; 454/184

(58) Field of Classification Search
USPC .............................................. 361/727, 679.49
See application file for complete search history.

(56) References Cited

U.S. PATENT DOCUMENTS

| 6,574,100 | B1 * | 6/2003 | Anderson ................... 361/679.5 |
| 7,218,526 | B2 * | 5/2007 | Mayer ........................... 361/725 |
| 7,898,804 | B2 * | 3/2011 | Olesiewicz et al. ............ 361/694 |
| 8,139,358 | B2 * | 3/2012 | Tambe .......................... 361/695 |
| 8,430,462 | B2 | 4/2013 | Chen et al. |
| 2003/0161114 | A1 * | 8/2003 | Berry et al. .................... 361/727 |
| 2004/0072534 | A1 * | 4/2004 | Wiley ............................. 454/184 |
| 2004/0129657 | A1 * | 7/2004 | Dean et al. ....................... 211/26 |
| 2006/0274508 | A1 * | 12/2006 | LaRiviere et al. ............. 361/727 |
| 2010/0103606 | A1 * | 4/2010 | Olesiewicz et al. ....... 361/679.33 |
| 2011/0063778 | A1 * | 3/2011 | Brouillard ..................... 361/678 |

FOREIGN PATENT DOCUMENTS

| TW | M399578 U1 | 3/2011 |
| TW | 201223420 A1 | 6/2012 |

* cited by examiner

*Primary Examiner* — Anthony Q Edwards
(74) *Attorney, Agent, or Firm* — Novak Druce Connolly Bove + Quigg LLP

(57) ABSTRACT

A server cabinet includes a rack, two slide rails, a server, and two brackets. Two first posts are formed at a front end of the rack, and two second posts are formed at a rear end of the rack. Each slide rail is fastened between the corresponding first post and second post. The server is connected between the slide rails and includes two opposite side plates. Each side plate and the corresponding slide rail bound a channel. Electronic components are mounted in a front end of the server. The brackets are fastened to the server and respectively fastened to front ends of the slide rails. A number of first through holes are defined in one of the brackets, aligning with the corresponding channel. A number of second through holes are defined in the side plate near the first through holes, behind the electronic components.

6 Claims, 2 Drawing Sheets

SERVER CABINET

BACKGROUND

1. Technical Field

The present disclosure relates to a server cabinet.

2. Description of Related Art

In a server cabinet, heat dissipation for electronic components of a server not only relies on system fans, but also relies on airflow vents defined in a front plate of the server. However, as the requirement of high data storage increases, a large number of hard disk drives are mounted in a front end of the server, the airflow in the cabinet is blocked by the hard disk drives.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
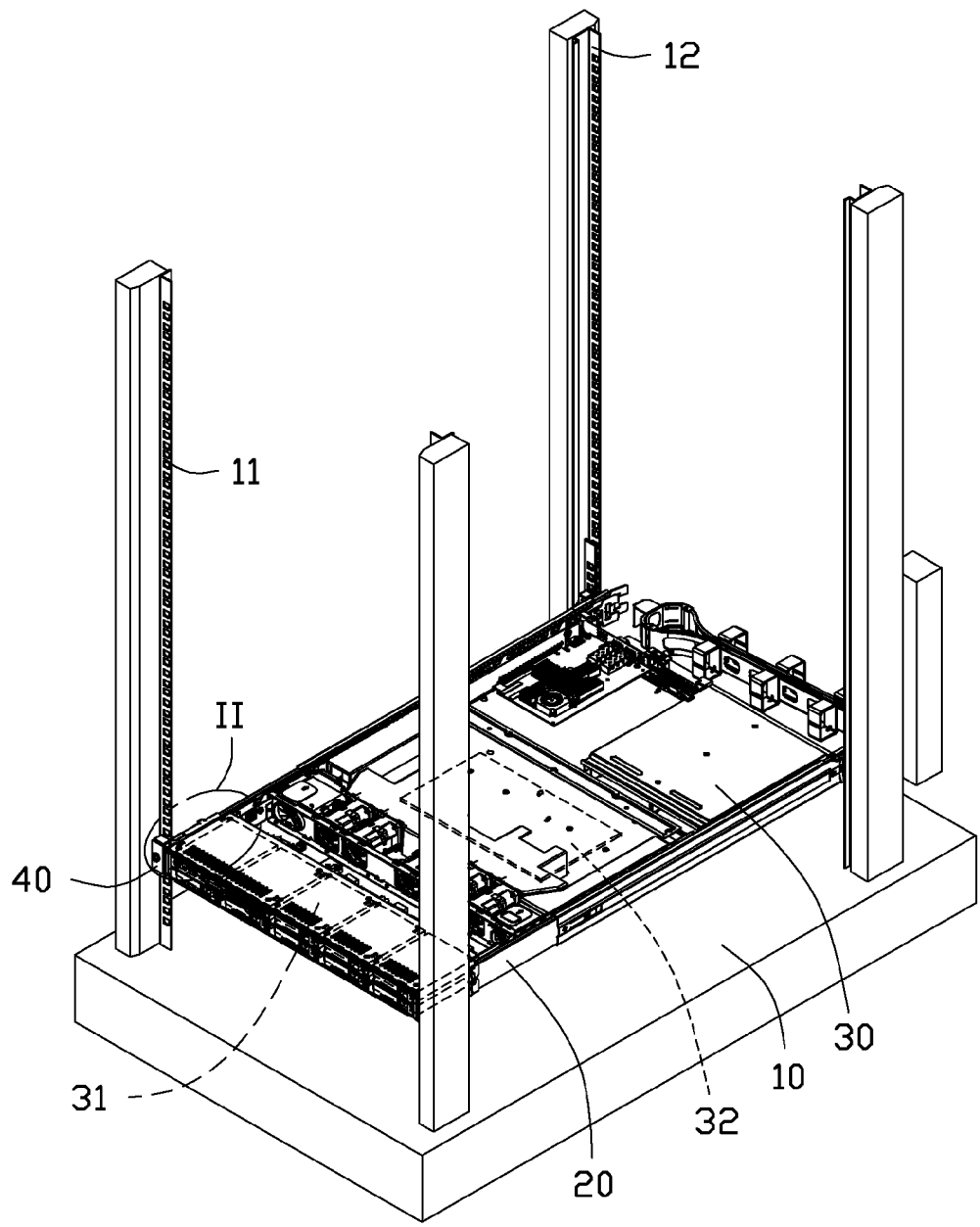
FIG. 1 is an isometric view of an exemplary embodiment of a server cabinet.

FIG. 1 shows an exemplary embodiment of a server cabinet. The server cabinet includes a rack 10, two slide rails 20, a server 30, and two brackets 40.

Two first posts 11 are formed on a front end of the rack 10, and two second posts 12 are formed on a rear end of the rack 10.

Each slide rail 20 is fastened between one of the first posts 11 and a corresponding one of the second posts 12.

Figure 2:
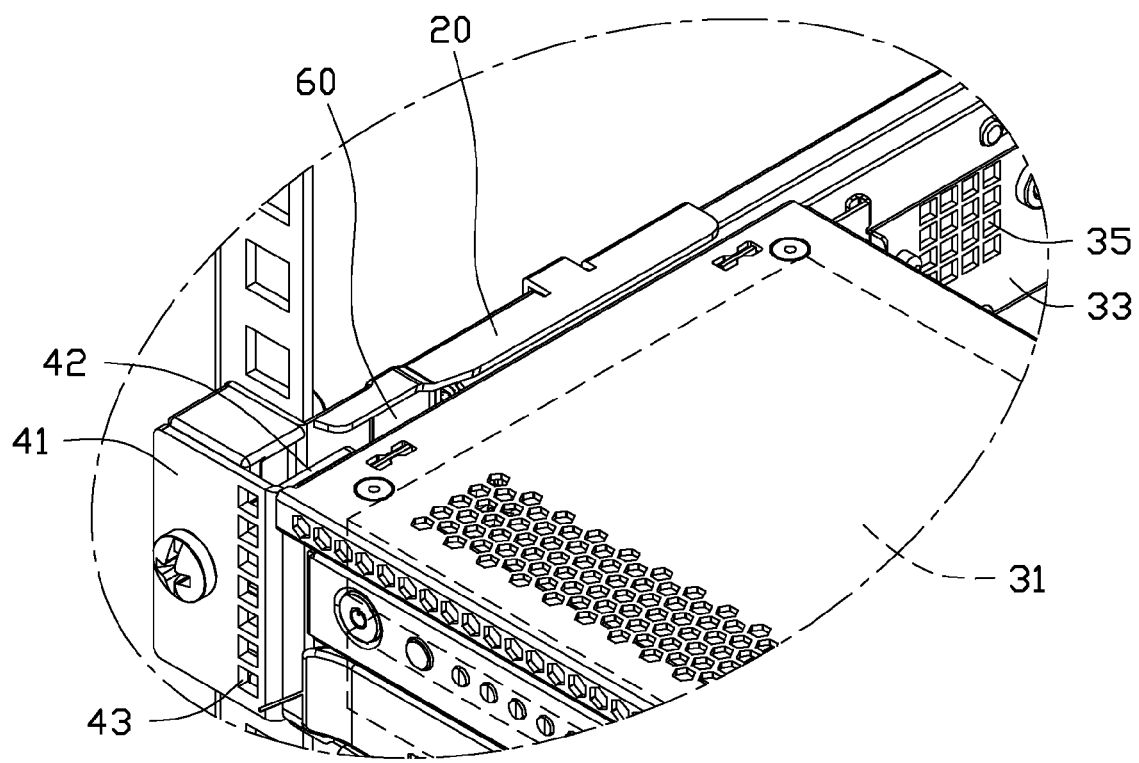
FIG. 2 is an enlarged view of a circled portion II of FIG. 1.

FIG. 2 shows the server 30 connected between the slide rails 20. The server 30 includes two opposite side plates 33 respectively adjacent to the slide rails 20. Each side plate 33 and the corresponding slide rail 20 bound a channel 60. A plurality of electronic components 31, such as hard disk drives, is mounted on a front end of the server 30 adjacent to the first posts 11. As shown in FIG. 2, side plates 33 are separate components from electronic component 31. A motherboard 32 is mounted on a middle of the server 30. A plurality of through holes 35 is defined in each side plates 33, behind the electronic components 31.

Each bracket 40 includes a base plate 41 and an extension plate 42 perpendicularly extending backward from a side of the base plate 41. The extension plates 42 are respectively fastened to front ends of the side plates 33. The base plates 41 are fastened to front ends of the slide rails 20 fastened to the first posts 11, and cover accesses of the channels 60. A plurality of through holes 43 is defined in each base plate 41, aligning with the corresponding channel 60.

Airflow enters the channels 60 through the through holes 43, and then enters the server 30 through the through holes 35, which has a benefit for heat dissipation of electronic components, such as a central processing unit on the motherboard 32, at middle and rear portions of the server 30. Therefore, heat dissipation efficiency of the server 30 increases.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A server cabinet, comprising:
a rack comprising two first posts formed on a front end of the rack, and two second posts formed on a rear end of the rack;
two slide rails, each slide rail fastened between one of the first posts and a corresponding one of the second posts;
a server, the server including at least one electronic component, the server connected to and between the slide rails and comprising two opposite side plates, each side plate separate from any electronic components of the server and respectively adjacent to the slide rails, each side plate and the corresponding slide rail bounding a channel; and
two brackets, each bracket fastened to the server and one of the front ends of the slide rails fastened to the first posts, at least one of the brackets defining a plurality of first through holes aligning with the corresponding channel, the side plate associated with the first through holes defining a plurality of second through holes.

2. The server cabinet of claim 1, wherein each bracket includes a base plate and an extension plate extending from a side of the base plate, the extension plate is fastened to a front end of the corresponding side plate, the base plate is fastened to the front end of the corresponding slide rail, the first through holes are defined in one of the base plates.

3. The server cabinet of claim 1, wherein the second through holes are positioned behind electronic components associated with the server.

4. A server cabinet, comprising:
a rack comprising two posts formed at a front end of the rack;
a server having at least one electronic component and comprising two opposite side plates, the side plates separate from any electronic components of the server; and
two brackets fastened to the server and respectively fastened to the posts, one of the brackets defining a plurality of first through holes between the corresponding post and the side plate, the side plate defining a plurality of second through holes.

5. The server cabinet of claim 4, wherein each bracket includes a base plate and an extension plate extending from a side of the base plate, the extension plate is fastened to a front end of the corresponding side plate, the base plate is fastened to the corresponding post, the first through holes are defined in the base plate of one of the brackets.

6. The server cabinet of claim 5, wherein the second through holes are positioned behind electronic components associated with the server.

* * * * *